(12) United States Patent
Stimpson et al.

(10) Patent No.: US 7,053,392 B2
(45) Date of Patent: May 30, 2006

(54) OPTICAL MEASURING APPARATUS FOR MEASURING OBJECTS ON MACHINES

(75) Inventors: Victor G. Stimpson, Avening (GB); Jon P. Fuge, Bristol (GB); William K. Davies, Bristol (GB); Norman J. Leete, Uley (GB); Colin T. Bell, Berkeley (GB)

(73) Assignee: Renishaw, PLC, Gloucestershire (GB)

( * ) Notice: Subject to any disclaimer, the term of this patent is extended or adjusted under 35 U.S.C. 154(b) by 0 days.

(21) Appl. No.: 10/947,345

(22) Filed: Sep. 23, 2004

(65) Prior Publication Data

US 2005/0167619 A1    Aug. 4, 2005

Related U.S. Application Data

(63) Continuation-in-part of application No. 10/678,075, filed on Oct. 6, 2003, now Pat. No. 6,878,953, which is a continuation of application No. 09/889,305, filed as application No. PCT/GB00/04403 on Nov. 17, 2000, now Pat. No. 6,635,894.

(30) Foreign Application Priority Data

Nov. 22, 1999  (GB)  .................................... 9927471
Aug. 25, 2000  (GB)  .................................... 0020929
Sep. 23, 2003  (GB)  .................................... 0322251

(51) Int. Cl.
*G01N 21/86* (2006.01)
*G01V 8/00* (2006.01)

(52) U.S. Cl. ........................... 250/559.14; 250/214 DC

(58) Field of Classification Search .......... 250/559.14, 250/559.12, 559.4, 559.24, 214 DC; 356/621, 356/638, 496; 408/6, 11, 16; 409/218, 134

See application file for complete search history.

(56) References Cited

U.S. PATENT DOCUMENTS

| 3,772,523 | A |   | 11/1973 | Montanvert et al. |
| 4,502,823 | A |   | 3/1985 | Wronski et al. |
| 4,518,257 | A |   | 5/1985 | Donaldson |
| 5,004,930 | A |   | 4/1991 | Gremaud et al. |
| 5,293,048 | A |   | 3/1994 | Skunes et al. |
| 5,433,649 | A |   | 7/1995 | Nishida |
| 5,786,602 | A | * | 7/1998 | Pryor et al. ............ 250/559.33 |
| 5,841,662 | A |   | 11/1998 | Cook et al. |
| 5,940,787 | A |   | 8/1999 | Gelston |
| 6,111,262 | A |   | 8/2000 | Takanashi |
| 2002/0118372 | A1 |   | 8/2002 | Bucher et al. |

FOREIGN PATENT DOCUMENTS

| DE | 3905949 | 8/1990 |
| DE | 4238504 C2 | 5/1994 |
| DE | 4244869 | 5/1994 |
| DE | 4323910 | 1/1995 |

(Continued)

*Primary Examiner*—Seung C. Sohn
(74) *Attorney, Agent, or Firm*—Oliff & Berridge, PLC

(57) ABSTRACT

The present invention teaches a method and apparatus for making measurement of an object on a machine, such as a machine tool, using an optical measuring apparatus which includes a light source for generating a beam of light which is incident on a detector. A detection signal is generated within the detector each time the beam is interrupted. The duration and/or frequency of the detection signals are evaluated and an output signal is emitted from the detection only if a further detection signal is present within the detector in a specified time interval from the generation of an earlier detection signal.

5 Claims, 4 Drawing Sheets

FOREIGN PATENT DOCUMENTS

| | | |
|---|---|---|
| DE | 4244869 | 8/1997 |
| EP | 0 098 930 | 1/1984 |
| EP | 0 511 117 A2 | 10/1992 |
| EP | 0584510 | 3/1994 |
| EP | 1 050 368 A1 | 11/2000 |
| FR | 2343555 | 10/1977 |

* cited by examiner

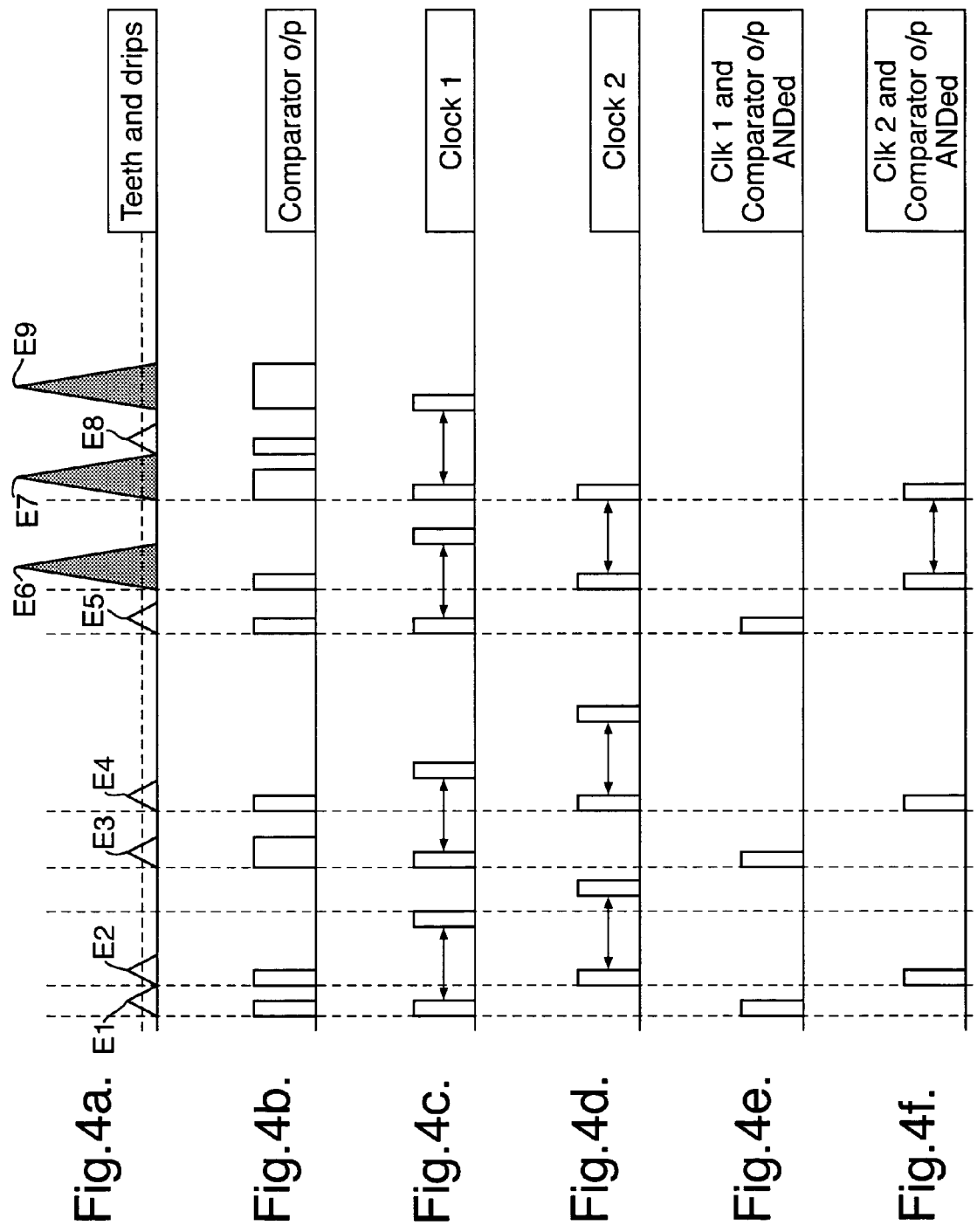

| 0 | 1 | 0 | 0 | 0 | 0 | 0 | 0 |
|---|---|---|---|---|---|---|---|
| 0 | 0 | 0 | 0 | 0 | 0 | 0 | 0 |

| 0 | 1 | 0 | 1 | 0 | 0 | 0 | 0 |
|---|---|---|---|---|---|---|---|
| 0 | 0 | 0 | 0 | 0 | 0 | 0 | 0 |

Fig 5e

| 0 | 0 | 1 | 0 | 1 | 0 | 0 | 0 |
|---|---|---|---|---|---|---|---|
| 0 | 0 | 0 | 0 | 0 | 0 | 0 | 0 |

Fig 5f

| 0 | 0 | 0 | 1 | 0 | 1 | 0 | 0 |
|---|---|---|---|---|---|---|---|
| 0 | 0 | 0 | 0 | 0 | 0 | 0 | 0 |

Fig 5g

| 0 | 0 | 0 | 0 | 1 | 0 | 1 | 0 |
|---|---|---|---|---|---|---|---|
| 0 | 0 | 0 | 0 | 0 | 0 | 0 | 0 |

Fig 5h

| 0 | 0 | 0 | 0 | 0 | 1 | 0 | 1 |
|---|---|---|---|---|---|---|---|
| 0 | 0 | 0 | 0 | 0 | 0 | 0 | 0 |

Fig 5i

| 0 | 0 | 0 | 0 | 0 | 0 | 1 | 0 |
|---|---|---|---|---|---|---|---|
| 1 | 0 | 0 | 0 | 0 | 0 | 0 | 0 |

Fig 5j

| 0 | 0 | 0 | 0 | 0 | 0 | 0 | 1 |
|---|---|---|---|---|---|---|---|
| 0 | 1 | 0 | 0 | 0 | 0 | 0 | 0 |

OPTICAL MEASURING APPARATUS FOR MEASURING OBJECTS ON MACHINES

CROSS REFERENCE TO RELATED APPLICATIONS

This is a continuation-in-part of U.S. patent application Ser. No. 10/678,075 filed on 6 Oct. 2003 now U.S. Pat. No. 6,878,953 which is a continuation of U.S. patent application Ser. No. 09/889,305 filed on 16 Jul. 2001 now U.S. Pat. No. 6,635,894 which in turn is the US national stage of International application PCT/GB00/04403 filed on 17 Nov. 2000.

The entire disclosure of the prior applications is hereby incorporated by reference herein in its entirety.

BACKGROUND OF THE INVENTION

1. Field of the Invention

The present invention relates to an optical measuring apparatus which enables a coordinate positioning machine (such as a machine tool) to determine the position of an object relative to a reference point. It may, for example, be employed on a machine tool for toolsetting operations.

2. Description of Related Art

A known-tool setting device for use on a machine tool includes a light source which generates a fine beam of light which is incident upon a detector. During a toolsetting operation, the machine is operated to move the tool in a direction transverse to the direction of propagation of the light beam until a part of the tool interrupts passage of the light beam. Detection of this interruption is used to produce a trigger signal in the detecting unit, which is used by the machine to establish the relative position of its moving parts in order to determine dimensions of the tool. Such devices are known, for example, from German Patent Nos. DE 42 385 04 and DE 42 448 69, French Patent No. 2,343,555, European Patent No. 98,930 and U.S. Pat. No. 4,518,257. The devices may be used additionally for measuring the length or diameter of a tool to monitor tool breakage or wear.

The devices disclosed in the above-mentioned patent specifications use a narrow light beam into or through which the tool is passed. The detection units detect when the tool breaks into the beam from the resulting drop in the intensity of the light falling on them. The trigger signal may be produced as a result of a predetermined drop in the intensity of light falling on the detector as the tool enters the beam.

A problem which arises with such optical measuring apparatus is that coolant used on the machine can drip through the beam, or be thrown off the rotating tool into the beam, during the measuring operation and give rise to false trigger signals.

One method of overcoming this problem which is currently used, is to program the software in the machine controller to perform several measurements until a pre-selected number of measurements falling within a given tolerance have been obtained. The position of the tool is then assumed to be the average of these measurements. This method can give rise to an unacceptable increase in the measurement cycle time if a significant number of repeat measurements have to be taken.

SUMMARY OF THE INVENTION

The present invention seeks to alleviate this problem by providing a method of measurement which can differentiate between a genuine tool detection signal, and a signal produced by a coolant drip.

According to one aspect of the present invention there is provided a method of making measurements of an object on a machine tool using an optical measuring apparatus which includes a light source which generates a beam of light which is incident upon a detector, the method comprising the steps of:

generating a detection signal within the detector each time the beam is interrupted;

evaluating the frequency and/or duration of the occurrences of said detection signals;

emitting an output signal from the detector only if a further detection signal is also present within the detector in a specified time interval from the generation of an earlier detection signal.

The timing of the detection signals can be achieved in various ways.

In one embodiment of the invention the tool is rotated, preferably, at a known specific speed. This gives rise to the generation of a regular sequence of said signals within the detector as the cutting edge (or edges) of the tool interrupt the beam. The generation of the first one of the said signals is used to initiate a timing sequence within the detector which sets a time interval ($t_1$) substantially equal to the time taken for one revolution of the tool, followed by a second time interval ($t_2$) which is substantially shorter than ($t_1$). If it is the tool which has generated the signals in the detector then a second signal will be generated in the time interval ($t_2$) as the cutting edge of the tool comes round again, and if this happens, the detector emits the output signal.

Alternatively, the generation of a detection signal within the detector can be used to start a clock which emits pulses of short duration synchronised with the speed of rotation of the tool. Again, if a second detection signal is generated within the detector during such a pulse then the detector emits an output signal. A number of clocks may be used which start sequentially as the detector generates its detection signals, and each of which stops if no second detection signal is generated within the detector during the next one of its pulses.

The invention also includes optical measuring apparatus for carrying out the method which comprises a light source for generating a light beam and a detector for receiving said beam and which generates a signal when the beam is interrupted, wherein the detector includes a detection circuit which generates a detection signal each time the beam is interrupted, and signal processing means for evaluating the frequency and/or duration of the occurrences of said detection signals and which emits an output signal only if a second signal is generated by the detection circuit within a specified time interval after the occurrence of an earlier detection signal.

BRIEF DESCRIPTION OF THE DRAWINGS

Examples of the invention will now be described, by way of example only, with reference to the accompanying drawings in which:

FIGS. 5a–k show examples of successive register entries generated in use by the signal processing circuit.

DETAILED DESCRIPTION OF PREFERRED EMBODIMENTS

Figure 1:
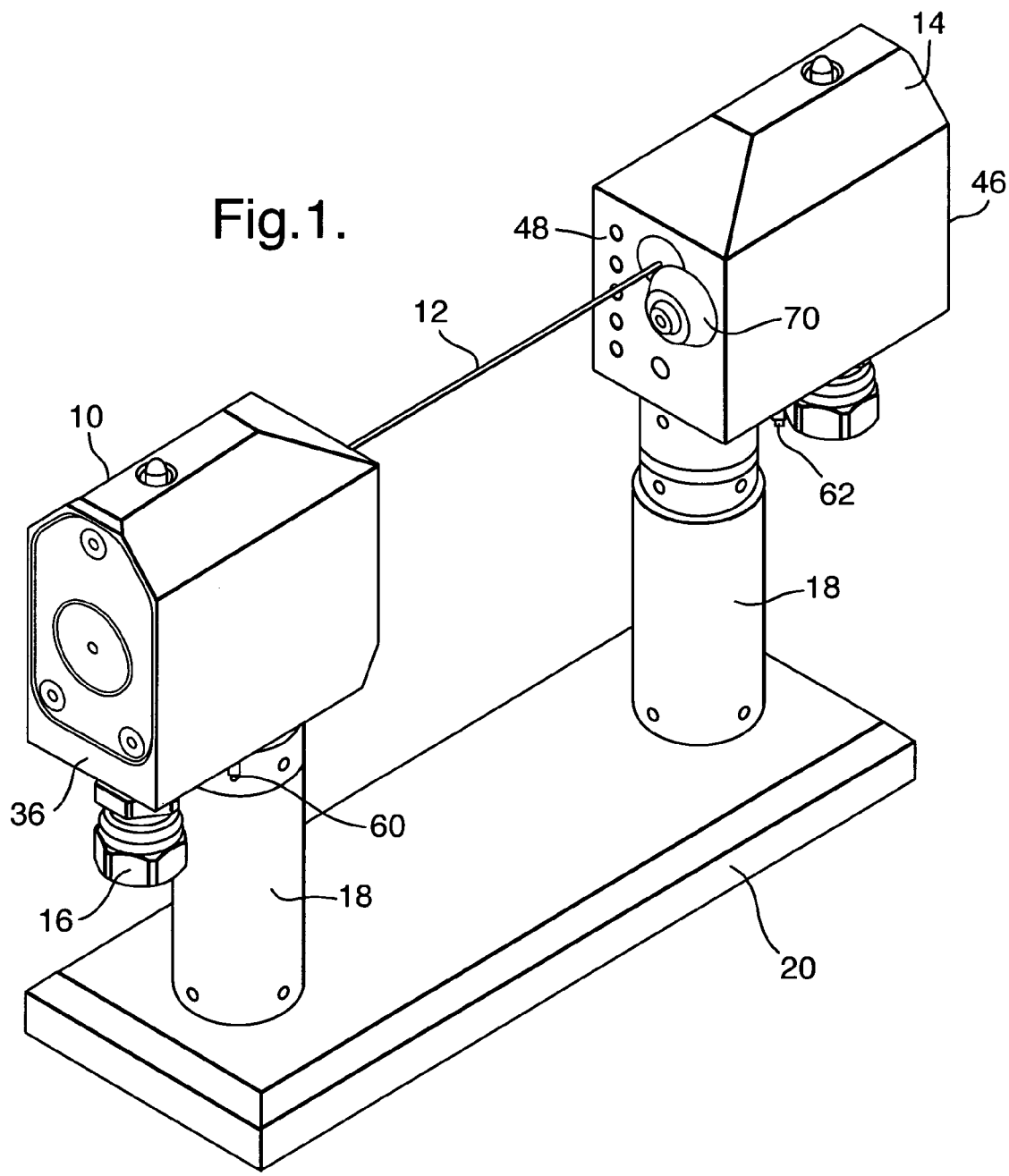
FIG. 1 is a perspective view of an optical measuring apparatus incorporating the present invention.

Referring now to FIG. 1, the optical measuring apparatus is shown in a set up arranged to operate as a toolsetting apparatus, suitable for use, for example, on a machine tool. The apparatus includes a light emitting unit 10 which emits a beam 12 of light, and a light detecting unit 14, where the light beam 12 is detected. Power and signal control cables to the light emitting and detecting units 10,14 are routed via inlet ports 16, and both the units 10,14 are advantageously mounted, via pillars 18, on the base of the machine, either via an intermediate base 20, to which they are both mounted, or directly to the base of the machine upon which they are to be employed.

In operation, the apparatus is used for toolsetting by operating the machine on which the apparatus is mounted to move the tool in a direction transverse to the direction in which the beam 12 is propagating. When a predetermined level of occlusion of the beam has been established, the detecting unit 14 emits a trigger signal which is used by the machine to determine the relative position of its relatively movable parts, thereby to enable dimensions of the tool to be determined.

Further mechanical and optical details of an example of such an apparatus are described in our European Patent Application No. 00303749.6 (which is hereby incorporated into this specification by reference) and are not therefore reproduced here.

However, column 6, line 43 to column 7, line 8 with reference to FIGS. 5,6a and 6b of EP 1050368 A1 (the published version of EP00303749.6) shows how detection signals P and Q are obtained when a tool enters or leaves a light beam. In that embodiment the detection signal P is at one lever L2 when the beam is occluded and at another lever L1 when the beam is not occluded. Detection signals are thus present if the beam is occluded or not occluded.

Figure 2:
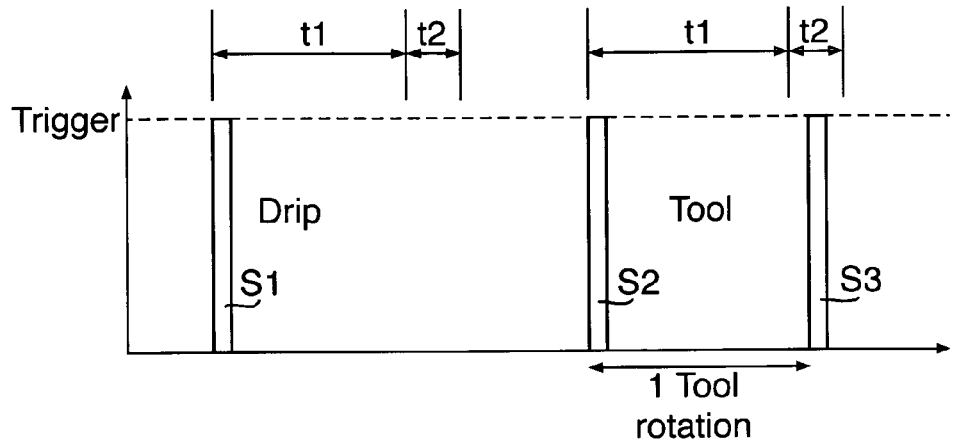
FIG. 2 is a representation of the output of the detector of FIG. 1.

FIG. 2 shows the output of the detector in various circumstances. The detector output goes high (i.e. produces a detection signal) as shown by a voltage pulse when the beam is occluded to said predetermined extent. As can be seen by the first pulse S1 at the left-hand side of the drawing this can occur when a coolant drip passes through the beam.

In the first instance however, the coolant drip is a single occurrence, which produces a single short duration pulse.

When the edge of the rotating cutting tool breaks the beam there is also a short duration pulse S2, but this is followed by further pulses S3 (only one shown) as the same cutting edge comes into the beam again, or as other cutting edges of a multi-edged tool cut the beam in turn.

In order to be able to identify the difference between occlusion of the beam by a drip, and occlusion of the beam by the edge of the cutting tool for the first time (which is the event which is required to be detected to measure the position of the cutting edge), the invention provides that a timer in the detector sets a first time interval $t_1$ simultaneously with the detector generating its detection signal. In a specific embodiment the time interval $t_1$ is arranged to be equal to the length of time it takes for one revolution of the tool. At the end of the time interval $t_1$ the timer sets a shorter time interval $t_2$.

The detector monitors the time interval $t_2$ for a second detection signal which is unlikely to occur if the first signal is a drip. This can be detected by either a high state of the output signal or a rising edge. If the second detection signal is present the detector issues a "skip" or trigger signal at the end of time interval $t_2$.

Since the time intervals $t_1$ and $t_2$ are accurately known the instant of the occurrence of the first rising edge of the detector output due to a cutting edge of the tool obscuring the beam can be calculated.

In order to calculate the timings, the speed of rotation of the machine spindle, and hence the cutting tool must be set. In order to keep the time for the measuring operation down a reasonable level, the spindle speed was set during experimentation at 1000 rpm so that $t_1$ was ostensibly 60 ms. The interval $t_2$ however, has to be large enough to cater for slight variations in spindle speed for example up to 5%, which would cause a 3 ms variation in $t_1$.

To centre the trigger signal in the time interval $t_2$, $t_2$ is set at $t_1+\frac{1}{2}t$ which must be equal to 60 ms. Thus $t_1$ was actually set at 58.5 ms.

It is not necessary for the speed of rotation of the tool to be known prior to measurements being taken since it can be measured by timing the distance between the rising edges of the first two consecutive pulses out of the sequence of pulses generated by the detector. The time interval ($t_1$) can then be set between the second and third rising edges and ($t_2$) can be timed from the third rising edge.

Figure 3:
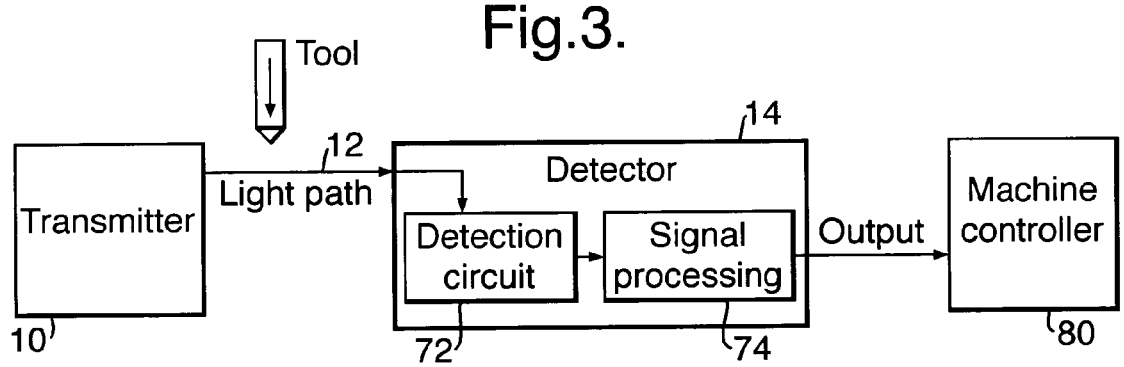
FIG. 3 is a block diagram representing the basic elements of the apparatus.

The basic elements of the apparatus of the invention are shown in block diagram form in FIG. 3. The light beam 12 from the transmitter 10 entering the detector 14 impinges on a photodetector in a detection circuit 72 which produces the signals when the beam is interrupted. Signals generated in the detection circuit 72 are passed to a signal processor 74 which includes the necessary timing devices for signal analysis. The detector output signals are passed directly to the machine controller 80 which stops the machine, and evaluates the machine scale readings to determine the position of the machine.

Figure 4:
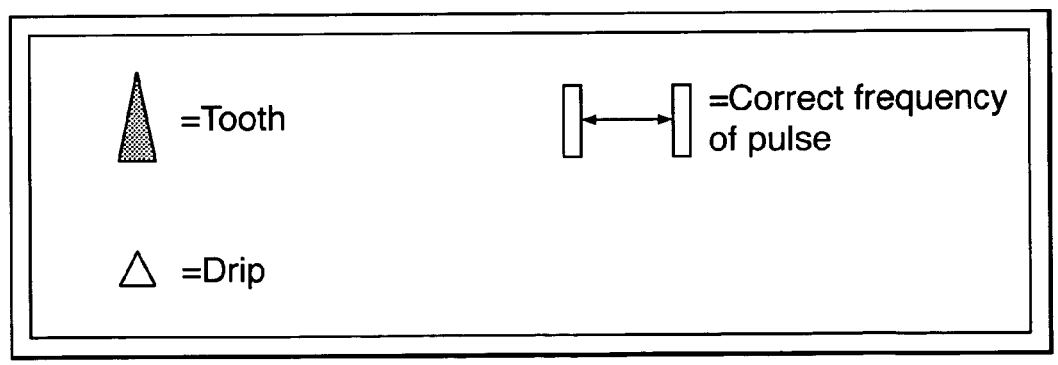
FIG. 4 illustrates in lines 4a to 4f the signals generated in various parts of the signal processing circuit of the detector.

FIG. 4 illustrates an alternative embodiment in which one or more clocks in the detector are used, each of which generates a series of pulses initiated by the detector issuing a signal to indicate that the beam has been interrupted;

FIG. 4a shows an example of a series of events created by a mixture of teeth and drips interrupting the beam;

FIG. 4b shows the signals created by these events converted to pulses at the output of a comparator in the signal processor of the detector;

FIG. 4c shows the situation which occurs in the detector when a single clock is used;

FIG. 4d shows the situation which occurs in the detector when a second clock is used;

FIGS. 4e and 4f respectively show the results of combining the comparator output with the outputs of clock 1 and clock 2.

It can be seen from FIG. 4a that the drips occur and interrupt the beam at random intervals while the beam interruptions caused by the edge of the tool occur at regular intervals. Each beam interruption is labelled as a numbered event E.

FIG. 4b shows the comparator output pulses corresponding to the events.

FIG. 4c shows that the first clock starts when event E1 occurs but because there is no event occurring when the second clock pulse is sent to the signal processor the clock is stopped. The clock is started again on the occurrence of event E3 which is also a drip, but again because its second pulse occurs between events E4 and E5 it will not see event E4 and will stop. The situation is the same when it starts again at event E5. Only when it starts again at event E7 will its pulses be synchronised with the occurrences of the cutting edge of the tool interrupting the beam at event E9 and beyond so that a trigger signal will be produced on event E7. This signal will have missed the first occurrence of the cutting edge interrupting the beam at E6 and will produce an erroneous reading.

With the embodiment which uses two clocks however, as shown in FIG. 4*d*, the second clock will be started on event E6 because at that time the first clock is running. Since event E6 is an interruption of the beam by an edge of the cutting tool there will be a further event E7 occurring when the clock pulse is generated. The signal processor will recognise that the clock pulses and the events have now become synchronised and will generate a trigger signal on the rising edge of the pulse. Since the generation of the clock pulses and the beam interruptions are synchronised, the time at which the first beam interruption occurred can easily be determined.

The situation is less complex if the first event is caused by a cutting edge of the tool, because the first clock will start and will see a synchronised event during its first pulse and cause a trigger signal at that time.

If a drip occurs between the first and second events this will be ignored by the first clock since it will not occur during its first pulse. Hence the drip will not affect the generation of the trigger signal under these circumstances.

Although the invention has been described using one or two clocks, other benefits may be achieved if more clocks were used which are set at different frequencies.

For example, the apparatus could be used at different speeds of spindle rotation without having to re-set the timing of the existing clocks, and additional clocks would allow the apparatus to deal with an atmosphere where a lot of drips could be expected. The number of clocks used would be a trade-off between the benefits to be obtained, and the expense of the additional signal processing capability required.

The invention can also be used when the tool is not rotating to measure tool length or diameter during tool setting, or for tool breakage detection. In such an embodiment the tool is moved at right angles to the beam until its tip or flank interrupts the beam. The signal produced by the detector is used to start a clock in the signal processor which evaluates the detector output after a time t. If the detector output is still high at that time, denoting a signal is still present, the signal processor produces a trigger signal.

In yet another embodiment, the signal processor may incorporate a device which identifies synchronous events. The inputs to the device are sampled at regular intervals and the samples are stored in a buffer of fixed length, the new contents constantly overriding the old. The buffer can be implemented using a shift register which monitors the detector output and writes its current state into the shift register each time a sample is taken. If the buffer is split across two bytes, testing for repetitive patterns can be achieved by comparing the two halves. For example, if the sample rate is eight times the speed of rotation of the tool and the result of each sample is shifted through two eight bit registers, when a first signal occurs this shows up as a high (1) in the first cell of the register. The sample moves through the register until it is passed into the first cell on the second half. If there has been no synchronous event the sample passes through the register to the end.

If however, another high sample is received in the first cell of the first half of the register just as the first sample moves into the first cell of the second half of the register then the two halves will become identical once again and a trigger signal will be issued.

The above embodiment is illustrated in more detail in FIGS. 5*a–k*. The table shown in FIG. 5 represents data bits in a shift register which are recorded, in this instance, every 7.5 mSec. The signal processing circuit 74 samples the signal from the detection circuit 72 eight times for each revolution of the cutting tool and the tool is rotating at 1000 rpm. An instantaneous sample can be made at each 7.5 mSec interval, or an average level of the signal for the last 7.5 mSec can be obtained. In this instance obscuring of the beam 12 below a threshold e.g. below 50% of full light level, at any time in the 7.5 mSec window will cause a "1" to be entered in the shift register at the sampling time. Otherwise, a "0" is entered into the register. The next sample causes all data in the register to shift along one space, as shown in FIG. 5*b* and so on. The register is divided into two halves and data from one half is compared with that from the other half. The two halves are logically ANDed together such that two "1"s produce an output of "1" which results in an output trigger from the detector 14. Thus, the output will only occur when two "1" samples are spaced at a 60 mSec interval. This will happen when a cutter tooth comes around again after breaking the beam. However drips etc will be random and unlikely to occur exactly 60 mSec apart so no triggers should occur for drips etc.

FIG. 5*a* shows a "1" in the first entry box which represents drip E5 (FIG. 4*a*). This progresses along the register as each new sample is taken. FIG. 5*c* shows the detection of tooth E6 (E5 having been displaced two places). Not until FIG. 5*k* is a tooth (E7) again detected at which point an output is made indicating that the tool has been detected because E6 and E7 AND together to make "1". So in this embodiment the tool is detected at E7 where as in the previous embodiment the tool is detected at E9.

It will be apparent that other sample rates are possible e.g. at ⅟16th of a revolution giving a sample rate of 3.75 mSec if the tool is revolved at 1000 rpm. Other rates and speeds are envisaged. The sample rate may be such that two or more revolutions are sampled rather than one. In this way different teeth on the cutter could be measured instead of the same tooth coming around again. The shift register could be larger or smaller than shown and could be some other memory device. The tool can be measured going into the beam or coming out of the beam with the embodiment described above. If measured coming out of the beam then a first trigger signal caused by the sequence of events as described above is held open for example for just over one revolution, by successive synchronous events. When the successive events stop i.e. the teeth of the cutter move out of the beam then a secondary trigger occurs to show that the tool has come out of the beam as a result of the first trigger signal being dropped and not held open by the events. Holding open can occur for example by use of a timer which is reset when the first trigger occurs but lapses when not reset by the first trigger.

In another embodiment the occurrences of signals from detection circuits 72 at the signal processor 74 above a threshold are logged in memory in the signal processor 74. Each signal is given a real time log. Subsequently real event times are deducted from preceding event times e.g. the previous ten event times. If the result of the subtraction equals the time taken for an integer value of a revolution of a tooth e.g. one, two or three revolutions (corresponding to 60,180,240 mSec) then a tooth has been detected rather than the drip etc. So a trigger signal can then be sent.

The invention has been described with reference to the elimination of spurious trigger signals in an optical measuring apparatus on a machine tool, but may have wider application using other forms of optical measuring apparatus on other types of machine. The scope of the invention is therefore, to be taken as that defined by the appended claims.

What is claimed is:

1. A method for making measurements of an object using an optical measuring apparatus having an output, which includes a light source which generates a beam of light, and a detector, upon which in use, and when the beam is not obscured, is incident the beam of light and which produces a signal dependent on the extent of the light incident at the detector, the method comprising:
   rotating the object;
   causing a beam of light to be emitted from the light source;
   moving the object relative to the beam;
   detecting the extent of the beam of light at the detector while the object is moved relative to the beam to determine the presence of the object;
   generating a signal from the detector when a predetermined extent of light is present at the detector;
   monitoring the occurrence of each signal from the detector; and
   causing an output to issue from the apparatus only if two monitored signals occur, a time interval between said two monitored signals being substantially equal to the time taken for the object to complete at least one rotation.

2. The method for making measurements of an object as claimed in claim 1, wherein monitoring the occurrence of each signal includes use of a shift register in which the occurrence of the signal is recorded, the shift register having data recorded therein in a scrolling manner, new data continually replacing old data.

3. The method for making measurements of an object as claimed in claim 2, wherein two or more recordings of the occurrence of a signal in the shift register which have a position in the register corresponding to the time taken for the object to complete at least one rotation cause the output to issue.

4. The method for making measurements of an object as claimed in claim 2, wherein the occurrence of the signal is recorded in the register if at any time in a predefined period the level of the signal exceeds a predefined value.

5. An apparatus for making measurements of an object, comprising:
   a light source which generates a beam of light;
   a detector, upon which in use, and when the beam is not obscured, is incident the beam of light and which produces a signal when a predetermined extent of the light incident at the detector is reached to determine the presence of an object, the object being rotated; and
   a signal processor, including a memory, that monitors and records each signal from the detector, and that produces an output only if two recorded signals occur having a recording position, in the memory, corresponding to the time taken for the object to complete at least one revolution.

* * * * *